United States Patent [19]

Gohl

[11] Patent Number: 4,631,623
[45] Date of Patent: Dec. 23, 1986

[54] DC POWER CONTROL CIRCUIT WITH STATUS REPORTING AND PROTECTION AGAINST OVERLOADS AND SHORT CIRCUITS

[75] Inventor: Pierre Gohl, La Colle sur Loup, France

[73] Assignee: La Telemecanique Electrique, France

[21] Appl. No.: 678,855

[22] Filed: Dec. 6, 1984

[30] Foreign Application Priority Data

Dec. 6, 1983 [FR] France ............................ 83 19465

[51] Int. Cl.⁴ ............................................. H02H 3/26
[52] U.S. Cl. ...................................... 361/86; 361/90; 307/200 A
[58] Field of Search ....................... 361/18, 98, 78, 86, 361/88, 90–93; 307/350, 200 A

[56] References Cited

U.S. PATENT DOCUMENTS 3,679,965  8/1972  Wilkinson .............................. 361/90
4,225,795  9/1980  Keeney .................................. 361/86

Primary Examiner—A. D. Pellinen
Assistant Examiner—Jeffrey A. Gaffin
Attorney, Agent, or Firm—William A. Drucker

[57] ABSTRACT

A DC power control circuit with status report and protection against overloads and short circuits is provided in which the output stage comprises at least one output amplifier whose input receives an external control logic signal and whose output is connected, through a current limiter, to the output of the circuit. The control circuit further comprises a voltage threshold detector which compares the residue voltage of the output stage with a threshold voltage corresponding to a maximum acceptable difference and which delivers a report signal representative of the sign of the difference between the residue voltage and the threshold voltage.

3 Claims, 4 Drawing Figures

DC POWER CONTROL CIRCUIT WITH STATUS REPORTING AND PROTECTION AGAINST OVERLOADS AND SHORT CIRCUITS

BACKGROUND OF THE INVENTION

1. Field of the Invention

The present invention relates to a DC power control circuit suitable more especially, but not exclusively, for controlling and/or supplying the power circuits of automatic devices.

2. Description of the Prior Art

Generally, it is known that circuits of this kind already exist equipped, for example, in the way described in patent FR No. 2 254 136, with a protection device comprising an AND gate one input of which receives the control signal and the output of which controls an output amplifier. In this example, the output circuit of this amplifier comprises a current limiting means followed by a current sensing means. The voltage taken from the terminals of this current sensing means is applied to a threshold comparator which controls a flip-flop.

When this flip-flop has switched through detection of an overcurrent, it transmits pulses generated by a clock to the other input of the AND gate, which causes chopping of the output current, so reducing it to a mean acceptable value during the existence of the overload.

Such a device has the following drawbacks:
- operation of the limiter corresponds to a disturbance which causes non execution or partial execution of the logic signal received by the protected output without the control logic being informed of these defects in executing the order received;
- other reasons, such as a defect in the power supply or in the output amplifier, may cause non execution of the logic order received without the control logic being informed.

Such incoherences between the logic state and the physical state of the members of an automatic device may have serious consequences which place the automated system and even the persons in the vicinity in danger if no device allows these incoherences to be detected and taken into account so as to avoid dangerous operating modes.

SUMMARY OF THE INVENTION

The aim of the invention is to overcome these disadvantages. It provides more particularly an efficient protection for each of the power circuits of an automatic device while supplying (to the designers and users) signals reporting on the execution of the logic output orders; these report signals thus allow the designers to incorporate in the automatic devices complementary operating conditions using this logic information so as to eliminate the incoherent and dangerous operating modes while tripping off alarms and specific safety procedures.

To arrive at this result, the power control device of the invention has an output stage comprising, in a way known per se, at least one output amplifier connected by its input to a control circuit delivering an external control logic signal, and whose output is connected, through a current limiter, to the S output of the device, to which a service load may be connected. This device further comprises a voltage threshold detector which compares a residue voltage representative of the difference between the supply voltage of said output stage and the output voltage, with a threshold voltage corresponding to a maximum acceptable difference, and which delivers a non overload signal when said residue voltage is less than said threshold voltage.

According to one feature of the invention, the signal delivered by the voltage threshold detector is applied to one input of a first circuit providing the logic function AND, whose other input receives an image logic signal of the intermediate signal present upstream of said current limiter, so that this first logic circuit supplies a report signal on the execution of the logic order applied to the amplifier. Furthermore, control of said amplifier may be advantageously conditioned by the report signal so as to interrupt transmission of the external control signal when a disturbance occurs such as an overload or a short circuit. For this, the output amplifier is connected, by its input, to the output of a second logic circuit providing the function AND which receives at its respective inputs said external control logic signal and said execution report signal.

The device of the invention may further comprise a tripping means adapted to apply to the output amplifier a control signal, when there is coincidence between a tripping pulse and the external control logic signal of said device, said pulse being supplied periodically by a generator or generated as a function of the rising edge of said control signal. This generator may advantageously consist of a clock connected to means for causing, in the case where under the effect of the external control logic signal the device is brought to operate under overload or short circuit conditions, the periodic forced conduction of the amplifier under frequency and cyclic ratio conditions such that the corresponding dissipation conditions are compatible with the conditions of use prescribed for said amplifier.

BRIEF DESCRIPTION OF THE DRAWINGS

Some embodiments of the invention will be described hereafter by way of non limitative examples with reference to the accompanying drawings in which.

DESCRIPTION OF THE PREFERRED EMBODIMENTS

Figure 1:
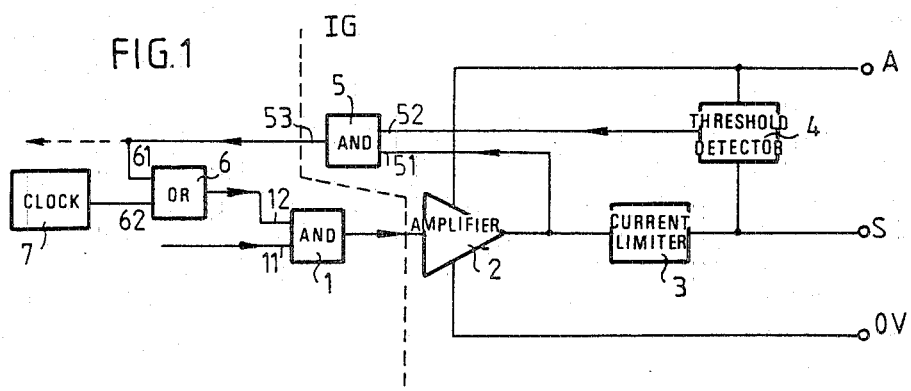
FIG. 1 is a block diagram of a power control circuit according to the invention.

In the example shown in FIG. 1, the on or off signal controlling this output circuit is applied to the input 11 of the an AND gate 1 having two inputs and whose output is connected to the input of an amplifier 2; the output of this amplifier is, on the one hand, connected to an output terminal S of the device through an instantaneous current limiting device 3 and, on the other hand, through the input 51 of a two input AND gate 5. The output amplifier 2 is connected to a power supply circuit (not shown) by terminals A and $O_v$. The residue voltage in state "1" of the static switch formed by this amplifier 2 is controlled by a threshold detector 4 whose output is at "1" when said residue voltage is less than the fixed threshold; the output of this detector 4 is connected to the input 52 of the AND gate 5. The output 53 of this AND gate 5 forms the terminal for "reporting" execution of the logic order received. This output 53 is, on the one hand, accessible to the user for example by means of a connection device not shown and is, on the other hand, connected to the input 61 of an OR gate 6 whose other input 62 is connected to the output of a clock 7; the output of this "OR" gate 6 is connected to the input 12 of the AND gate 1.

For using this type of output circuit in logic structures such as programmable automatic devices, it is preferable to galvanically isolate the output circuit from the control and monitoring circuits, which is shown symbolically by the broken line IG in the diagram of FIG. 1.

As long as the control signal applied to input 11 of the AND gate 1 remains zero, the input and the output of the amplifier 2 also remain at zero, as well as the inputs 51 and 52 of the AND gate 5 whose output 53 thus remains zero; the OR gate 6 therefore receives a zero at its input 61 and a cyclic signal from clock 7 at its input 62; the output of this OR gate 6 therefore applies said cyclic signal to the input 12 of the AND gate 1 whose output remains at zero as long as its other input 11 itself remains at zero. When the control signal applied to input 11 passes to "1", as soon as this signal first coincides with a "1" level at the output of clock 7, the AND gate 1 generates a "1" signal which enables the output amplifier 2; in normal operation of amplifier 2 and in the absence of an excessive residue voltage between terminals A and S, the enabling of amplifier 2 generates logic "1"s at the inputs 51 and 52 of the AND gate 5 whose output 53 connected to the input 61 of the OR gate 6 passes to "1", which makes its output connected to the input 11 of the AND gate 1 pass to state "1"; the state reporting signal available at the output of the AND gate 5 and applied by the OR gate 6 to the input 12 of the AND gate 1 provides self holding of the control of the amplifier 2 as long as the control signal applied to the input 1 remains at level "1".

When this control signal passes to zero, the output of the AND gate 1 also passes to zero which disables the output amplifier 2 and resets the report signal supplied via the AND gate 5.

The behavior of this device on the appearance of a short circuit of the output load is then as follows: when a short circuit or an overload appears while the output stage is enabled, the current limiter 3 protects the amplifier 2 by clipping the current to an acceptable instantaneous value and the increase of the residue voltage "$V_a - V_s$" caused by this current limitation trips the threshold detector 4 whose output connected to the input 52 of the AND gate 5 passes to zero, the report signal available at the output 53 of this gate 5 then passes to zero, which on the one hand informs the control logic of the automatic device assembly that the order applied to input 11 has not been executed and, on the other hand, interrupts the self hold signal transmitted by the OR gate 6 to the input 12 of the AND gate 1. On the other hand the signals from clock 7 applied to the input 62 of the OR gate 6 still reach the input 12 of the AND gate 1 and cause forced periodic conduction of amplifier 2, despite the overload or the short circuit, as long as the logic signal applied to input 11 remains at the level "1". The frequency and the cyclic ratio of the signal generated by said clock 7 are chosen in correlation with the peak current fixed by the limiter 3 so as to impose dissipation conditions which can be supported by the output amplifier 2.

In the case where the control logic signal applied to input 11 passes from zero level to the "1" level whereas the output terminals S and OV are already short circuited or connected to a load with insufficient impedance, amplifier 2 also begins to conduct from the first coincidence with a level "1" of the signal from clock 7, which causes the input 51 of the AND gate 5 to pass to "1", but the limiter 3 comes into action and causes excessive residue voltage which trips detector 4 whose output connected to the input 52 of the AND gate 5 remains at zero, which holds the report signal available at the output 53 of this gate at zero and so prevents the previously described self hold signal from passing to "1"; it follows then that the output amplifier 2 will only be enabled, in the presence of this overload or of this short circuit, at the timing imposed by clock 7 and as long as the logic signal applied to input 11 remains at level "1".

If the overload or the short circuit disappears while the output is receiving a control signal "1" the current limiter 3 ceases its action, the voltage becomes normal again, detector 4 then generates a signal "1" applied to the input 52 of the AND gate 5, which allows self holding of the control of the amplifier 2 as long as the control signal applied to input 11 remains in state "1".

In the case of a defective power supply applied to terminals $V_a$ and $O_{volt}$ while the output is in state "1", the disappearance of voltage does not cause an excessive residue voltage and the output of detector 4 remains at level "1" but the output of amplifier 2 passes to zero as well as the input 51 of the AND gate 5, which causes the report signal available at the output 53 of this gate to pass the zero and thus informs the central control logic that the order applied to input 11 of this circuit has not been executed.

Should the voltage $V_a$ - OV disappear while the logic control signal was zero, when this signal passes to "1", the input 51 of the AND gate 5 remains zero and thus holds the report signal available at output 53 of this gate at zero, which allows the central control logic to be informed that the order applied to input 11 of this circuit has not been carried out.

Figure 2:
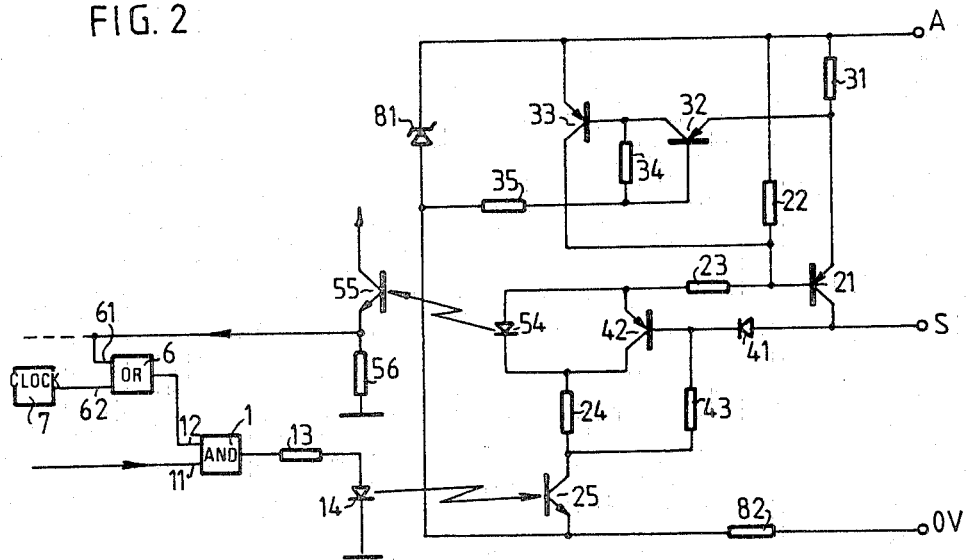
FIG. 2 shows the circuit diagram of a first embodiment of a power control circuit according to the invention.

FIG. 2 shows the detailed circuit diagram of one embodiment of the invention in which the component parts corresponding to the different functions of the block diagram of FIG. 1 bear either the same number or numbers in which the 10's is that of the corresponding function.

Clock 7, the OR gate 6 and the AND gate 1 are connected together as in the block diagram previously described; the output of the AND gate 1 is connected by a resistor 13 to the emitting diode 14 of a photocoupler whose phototransistor 25 is connected to the base of a PNP output transistor 21 through a resistor 24, an emitting diode 54 and a resistor 23 connected in series, in this order, from the collector of the phototransistor 25 whose emitter is connected to the common point between the anode of a Zener diode 81 and a resistor 82 whose other end is connected to the zero volt terminal provided for the corresponding pole of the external DC power supply; the cathode of this Zener diode 81 is connected to the terminal provided for the positive pole of said external power supply.

The emitter of the output transistor 21 is connected to terminal A through a series resistor 31 and a resistor 22 is connected between this terminal A and the base of this transistor 21.

The collector of this transistor 21 is connected to the common point between the anode of a diode 41 and an output terminal S, which terminal is provided for connecting the hot point of the load supplied by this output, the other end of this load being of course connected to the zero volt terminal; the cathode of diode 41 is connected through a resistor 43 to the common point between resistor 24 and phototransistor 25; the common point between diode 41 and resistor 43 is further connected to the base of a PNP transistor 42 whose emitter and collector are respectively connected to the anode and the cathode of the emitting diode 54.

A PNP transistor 33 has its emitter connected to terminal A and its collector connected to the common point between transistor 21 and resistor 23; the base of this transistor 33 is connected to the collector of a PNP transistor 32 whose emitter is connected to the common point between resistor 31 and transistor 21; the base of transistor 32 is connected to the anode of the Zener diode 81 through a resistor 35 and a resistor 34 connects together the collector and the base of transistor 32. The emitting diode 54 forms part of a photocoupler whose phototransistor 55 is connected to the common point between the input 61 of the OR gate 6 and a resistor 56 whose other end is connected to the zero volt of the control logic; this common point between phototransistor 55, resistor 56, and the AND gate 6 comprises a connection or a connection means with the central control logic.

The operation of the circuit described above and shown in FIG. 2 is then as follows:

When this circuit is normally supplied with power between its terminals A and $O_v$, as long as it receives at the input 11 of the AND gate 1 a zero control signal, the output of this gate remains at zero, the emitting diode 14 is not energized and the phototransistor 25 remains disabled, as well as transistors 21, 33, 42 and 55; only transistor 32 conducts via resistors 31, 34 and 35 because of the voltage applied to this limiter circuit by resistor 82 and the Zener diode 81. When the same circuit shown in FIG. 2 receives a logic signal "1" at the input 11 of the AND gate 1, from the first coincidence of this signal with a level "1" at the output of clock 7, the AND gate 1 generates a signal "1" which, via resistor 13, energizes the emitting diode 14 whose radiation saturates the phototransistor 25; if the charge connected by the user between terminals S and $O_v$ does not absorb a current greater than the threshold of the current limiter 31 to 35, saturation of transistor 21 through resistors 23 and 24 in series with the emitting diode 54 saturates the phototransistor 55 which causes a level "1" to appear at its common point with resistor 56 and the input 61 of the OR gate 6 which applies this "1" to the input 12 of the AND gate 1: as in the case of the bock diagram of FIG. 1, it can be seen that the report signal appearing at the emitter of the phototransistor 55 ensures the self hold of this output circuit in state "1" as long as the input 11 of the AND gate 1 receives the control signal "1".

On the other hand, as soon as said control signal applied to this input 11 passes again to zero, the emitting diode 14 is no longer energized and the phototransistor 25 ceases conducting, which disables transistor 21.

The operation of the current limiter 31 to 35 under normal conduction operating conditions, then with overload of transistor 21 may be stated as follows:

In the presence of an external load between terminals S and $O_{volt}$, when a logic signal "1" is applied to the input 11 of the AND gate 1, it causes saturation of transistor 21 unless its base current is cancelled out by conduction of transistor 33; when the output current "I" flowing through resistor 31 remains less than the limitation threshold of this circuit, only transistor 32 conducts. In fact, designating by $V_{BE33}$ the conduction threshold of this transistor 33, the following inequality is achieved:

$$R_{31}I + V_{CE32} < V_{BE33}$$

$V_{BE33}$ being the emitter-base voltage of transistor 33, $V_{CE32}$, the collector-emitter voltage of transistor 32 and $R_{31}$ the value of resistor 31.

It is also possible to define the conduction threshold of this transistor 33 by calculating the current $I_O$ which is established when transistor 32 is disabled. In this case, the following relationship is formed:

$$V_{z81} = V_{BE33} + I_O(r_{34} + R_{35})$$

$V_{z81}$ being the voltage at the terminals of the Zenner diode 81, $R_{34}$ and $R_{35}$ being the respective values of resistors 34 and 35.

From this relationship the following expression for $I_O$ may be deduced:

$$I_O = (V_{z81} - V_{BE33})/(R_{34} + R_{35})$$

So that transistor 33 remains disabled, it is sufficient for a current slightly greater than $I_O$ to flow through resistors 34 and 35 from transistor 32 and resistor 31. Taking again the relationship concerning the output current I:

$$R_{31}I + V_{CE32} < V_{BE33}$$

and replacing the voltage $V_{CE32}$ by an equivalent difference calculated from current $I_O$, considering that it is operating as a non saturated amplifier ($R_{34} I_O < 0.2$ Volt) and that the gain of this transistor 32 is fairly large so as to make the base current negligible with respect to $I_O$, we have:

$$R_{31}I + V_{BE32} - R_{34}I_O < V_{BE33}$$

in which equation the base-emitter voltage of the transistor 32 designates the conduction threshold of this transistor. Simplifying, by using the base-emitter voltages $V_{BE}$, physically very closely related, of transistors 32 and 33, we have:

$$R_{31}I < R_{34}I_O$$

From which $$I < (R_{34}/R_{31}) \times I_O$$

When the output current I reaches the following limit $I_{max}$:

$$I_{max} = I_O \times (R_{34}/R_{31})$$

transistor 33 begins to conduct and reduces the base current of the output transistor 21 so that it complies with this limit value; in the presence of an output load with too low an impedance, this circuit therefore limits the instantaneous current delivered by desaturating transistor 21.

The operation of the residue voltage control circuit of the output amplifier associated with its limiter is as follows: when the output amplifier operates within its limits, transistor 21 is saturated, the emitting diode 54 conducts as well as diode 41 in series with resistor 43 but transistor 42 is disabled.

On the other hand, when a load with insufficient impedance is supplied by this output amplifier, the limiter comes into action and prevents saturation of the output transistor 21 which causes lowering of the potential at terminal S which becomes less than that of the emitter of transistor 42, diode 41 ceases to conduct whereas transistor 42, saturated by the base current flowing through resistor 43, short circuits the emitting diode 54 which ceases to energize the phototransistor 55 and the report signal applied to input 61 of the OR gate 6 passes to zero, thus reflecting the disturbance of the logic order applied to input 11. This cancelling of the report signal causes suppression of the selfhold in state "1" of the output which is now only controlled during the forcing pulses from clock 7, transmitted by the OR gate 6 and combined in an AND operation with the control signal by gate 1: as long as the logic control and the overload persist, this output circuit operates then under chopping conditions in which the peak current is fixed by the limiter and whose cyclic ratio is established by the forcing clock 7.

The operation of the circuit shown in FIG. 2, should an external power supply failure occur, is as follows:

When an external power supply breakdown interrupts the supply to the load connected to this output when the control signal applied to input 11 is at "1", this lack of voltage interrupts all the currents flowing between terminals A and $0_{volt}$ and in particular the current from the emitting diode 54; the report signal applied to the input 61 of the OR gate 6 falls again to zero, which warns the central logic that the order applied to input 11 of this circuit has not been executed. It will be noted that certain failures of the output circuit itself are detectable by the central logic which ascertains the incoherences between the control signal applied and the report signal sent back; for example, the malfunction of transistor 21 despite a control current at the level of the emitting diode 14 and transistor 25 causes inhibition of the report by conduction of transistor 42.

Figure 3:
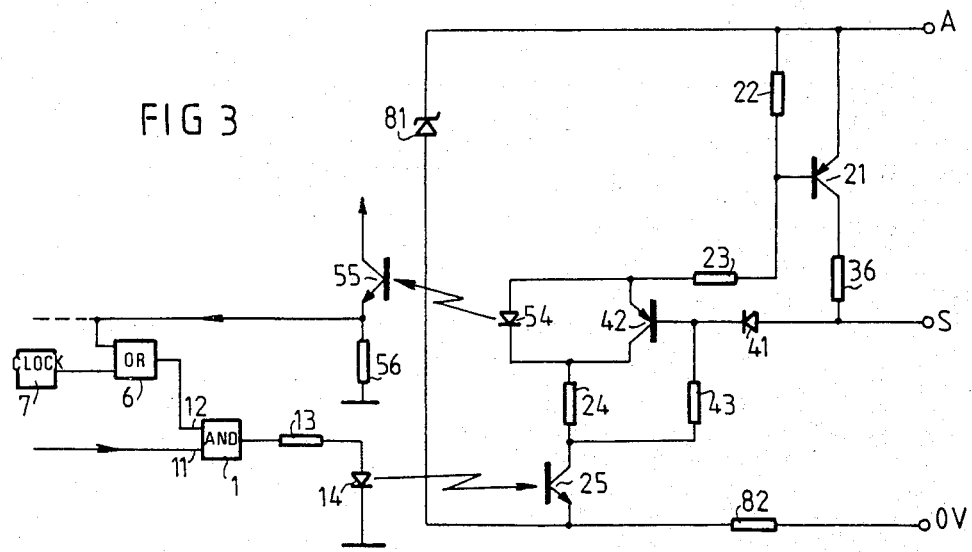
FIG. 3 illustrates a second embodiment of the invention using a simplified current limiter.

FIG. 3 shows a variant of the preceding circuit with a current limiter simplified to the extreme since it is reduced to the single resistor 36; the other functions remain identical, bear the same references and their operation corresponds to the explanations given in connection with FIG. 2.

Figure 4:
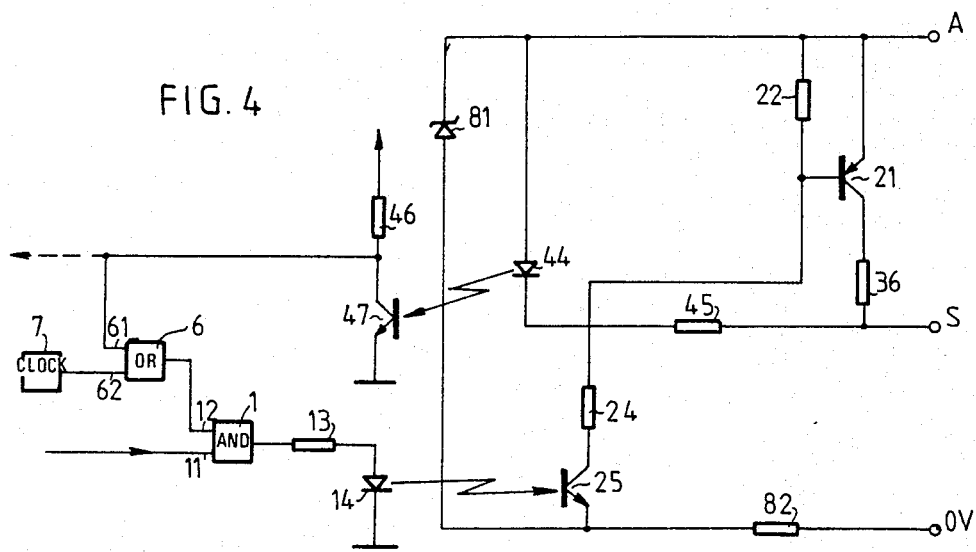
FIG. 4 is a simplified example of forming a circuit according to the invention.

FIG. 4 shows a variant using the limiter reduced to a single resistor 36 of the FIG. 3 and comprising a very simplified excessive residue voltage detection circuit which only comprises a resistor 45 in series with an emissive diode 44 energized in the case of an excessive residue voltage and whose signal is inverted by the photocoupler 47 associated with resistor 46; this simplification imposes a certain current flow through the load when the output control is zero since circuit 44, 45 closes again through said load. Furthermore, the failures of the external power supply connected to terminals A and 0 volt are not detectable in state "1", but in state "0" of the control signal.

It should be noted that the invention is not limited to the embodiments described above. In particular, the power control device of the invention could comprise any other combination of means such as programmable logic networks or demultiplexers providing, from an external logic control signal from a clock and from said execution report signal, selfhold of the control of the amplifier in accordance with the above described operation.

Furthermore, as mentioned above, the power control device of the invention may be advantageously used in logic structure such as programmable automatic devices comprising for example an output interface connected to the bus of the automatic device, and the output cards having output terminals. In this case, the power control device may be advantageously connected between said interface and said output terminals.

What is claimed is:

1. A DC power control device comprising:
   i- an output stage including an output amplifier having an input and an output, a current limiter connected to the output of said output amplifier, said current limiter having an output, a source of power supply voltage for said output stage and a threshold detector comparing the difference between the power supply voltage from said source and the voltage at the output of said current limiter to a predetermined threshold voltage, said threshold detector having an output on which a non overload signal is generated when said difference is less than said predetermined threshold voltage;
   ii- means for applying a control logic signal to the input of said output amplifier;
   iii-first AND circuit means having an output, a first input connected to the output of said output amplifier and a second input connected to the output of the threshold detector, said first AND circuit means generating a report signal when the non overload signal is generated and the power supply voltage is present.

2. A DC power control device as claimed in claim 1, wherein said means for applying a control logic signal to the input of said output amplifier comprise second AND circuit means having a first input on which said control logic signal is applied, a second input, the device further comprising:
   iv- means connecting the output of the first AND circuit means to the second input of the second AND circuit means.

3. A DC power control device as claimed in claim 2, wherein said means connecting the output of the first AND circuit means to the second input of the second AND circuit means comprise OR circuit means having an output connected to the second input of the second AND circuit means, said OR circuit means having a first input connected to the output of the first and circuit means and a second input, the device further comprising:
   v- a clock means generating periodic pulses, said clock means having an output connected to the second input of said OR circuit means.

* * * * *